(12) United States Patent
Chiang et al.

(10) Patent No.: US 11,843,046 B2
(45) Date of Patent: *Dec. 12, 2023

(54) HIGH ELECTRON MOBILITY TRANSISTOR (HEMT)

(71) Applicant: UNITED MICROELECTRONICS CORP., Hsin-Chu (TW)

(72) Inventors: Huai-Tzu Chiang, Tainan (TW); Sheng-Hao Lin, Hsinchu County (TW); Kuan-Hung Liu, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 287 days.

This patent is subject to a terminal disclaimer.

(21) Appl. No.: 17/145,414

(22) Filed: Jan. 11, 2021

(65) Prior Publication Data

US 2021/0134994 A1    May 6, 2021

Related U.S. Application Data

(63) Continuation of application No. 16/521,548, filed on Jul. 24, 2019, now Pat. No. 10,923,586.

(30) Foreign Application Priority Data

Jul. 16, 2019   (CN) .................. 201910639471.X

(51) Int. Cl.
*H01L 29/778* (2006.01)
*H01L 29/423* (2006.01)
(Continued)

(52) U.S. Cl.
CPC .... *H01L 29/7786* (2013.01); *H01L 29/42316* (2013.01); *H01L 29/452* (2013.01);
(Continued)

(58) Field of Classification Search
CPC ... H01L 29/122–127; H01L 29/15–158; H01L 29/66431; H01L 29/66462;
(Continued)

(56) References Cited

U.S. PATENT DOCUMENTS 4,700,458 A * 10/1987 Suzuki .............. H01L 29/78684
257/E21.414
5,915,164 A * 6/1999 Taskar .................. H01L 29/802
257/E29.062
(Continued)

FOREIGN PATENT DOCUMENTS

EP    2 747 145 A2    6/2014
EP    2 747 145 A3    3/2017

OTHER PUBLICATIONS

Tae-Hyeon Kim et al., GaN Schottky Barrier MOSFET using Indium-Tin-Oxide as Source, Drain and Gate Material, 2010 IEEE International Conference of Electron Devices and Solid-State Circuits (EDSSC), pp. 1-4, XP031979054 ,2010.

*Primary Examiner* — Maliheh Malek
(74) *Attorney, Agent, or Firm* — Winston Hsu

(57) ABSTRACT

A high electron mobility transistor (HEMT) includes a buffer layer, a carrier transit layer, a carrier supply layer, a gate, a source electrode and a drain electrode. The buffer layer is on a substrate. The carrier transit layer is on the buffer layer. The carrier supply layer is on the carrier transit layer. The gate is on the carrier supply layer. The source electrode and the drain electrode are at two opposite sides of the gate, wherein each of the source electrode and the drain electrode includes a conductive layer and a conductive oxide layer stacked from bottom to top.

6 Claims, 4 Drawing Sheets

(51) Int. Cl.
*H01L 29/45* (2006.01)
*H01L 29/66* (2006.01)
*H01L 29/08* (2006.01)

(52) U.S. Cl.
CPC .... *H01L 29/66431* (2013.01); *H01L 29/0843* (2013.01); *H01L 29/66462* (2013.01)

(58) Field of Classification Search
CPC ... H01L 29/778–7789; H01L 29/41783; H01L 29/66636; H01L 21/823814; H01L 29/42316; H01L 29/452; H01L 29/0843; H01L 29/1066; H01L 29/2003; H01L 29/41766; H01L 29/454
See application file for complete search history.

(56) References Cited

U.S. PATENT DOCUMENTS

| | | | | |
|---|---|---|---|---|
| 5,990,531 | A * | 11/1999 | Taskar | H01L 21/28587 257/E29.062 |
| 6,046,063 | A * | 4/2000 | Jun | H01L 27/1248 438/30 |
| 6,417,519 | B1 * | 7/2002 | Imanishi | H01L 29/7783 257/11 |
| 7,049,240 | B2 * | 5/2006 | Fan | H01L 29/66242 438/189 |
| 7,126,189 | B2 * | 10/2006 | Hsieh | H01L 29/6656 257/408 |
| 7,129,542 | B2 * | 10/2006 | Park | H01L 29/0661 257/E29.183 |
| 8,384,089 | B2 * | 2/2013 | Sato | H01L 21/30617 438/746 |
| 8,946,032 | B2 * | 2/2015 | Lee | H01L 29/66522 438/285 |
| 9,219,099 | B1 * | 12/2015 | Liu | H10B 63/30 |
| 9,219,136 | B2 * | 12/2015 | Tajiri | H01L 29/155 |
| 9,379,191 | B2 * | 6/2016 | Hsu | H01L 29/1066 |
| 9,385,001 | B1 * | 7/2016 | He | H01L 21/32133 |
| 9,484,362 | B2 * | 11/2016 | Kim | H01L 27/1225 |
| 9,525,054 | B2 * | 12/2016 | Chiang | H01L 29/7783 |
| 9,793,417 | B2 * | 10/2017 | Kim | H01L 23/291 |
| 10,283,614 | B1 * | 5/2019 | Lu | H01L 29/1066 |
| 10,672,896 | B2 * | 6/2020 | Chen | H01L 29/41766 |
| 10,714,607 | B1 * | 7/2020 | Chiang | H01L 29/7786 |
| 11,296,214 | B2 * | 4/2022 | Lee | H01L 29/66462 |
| 11,367,779 | B2 * | 6/2022 | Chang | H01L 29/7786 |
| 2004/0094800 | A1 * | 5/2004 | Park | H01L 29/732 257/E29.183 |
| 2005/0093438 | A1 * | 5/2005 | Chen | H10K 59/123 313/506 |
| 2005/0186719 | A1 * | 8/2005 | Chen | H01L 29/66757 438/164 |
| 2007/0090422 | A1 * | 4/2007 | Ishii | H01L 27/124 257/E27.111 |
| 2008/0113497 | A1 * | 5/2008 | Tachibana | H01L 33/16 438/483 |
| 2008/0173898 | A1 * | 7/2008 | Ohmaki | H01L 27/0605 257/E27.012 |
| 2008/0303064 | A1 * | 12/2008 | Sato | H01L 29/1029 257/E21.403 |
| 2009/0008677 | A1 * | 1/2009 | Kikkawa | H01L 29/205 257/E29.253 |
| 2009/0146186 | A1 * | 6/2009 | Kub | H01L 29/42316 257/E29.315 |
| 2009/0166616 | A1 * | 7/2009 | Uchiyama | H01L 29/7869 257/43 |
| 2009/0173968 | A1 * | 7/2009 | Matsunaga | H01L 29/7787 257/E29.091 |
| 2009/0315077 | A1 * | 12/2009 | Chiu | H01L 29/778 257/E29.246 |
| 2009/0321718 | A1 * | 12/2009 | Liu | H10K 10/484 257/E29.273 |
| 2011/0189826 | A1 * | 8/2011 | Mita | H01L 29/41725 257/E21.403 |
| 2011/0220965 | A1 * | 9/2011 | Ohki | H01L 21/28264 257/E21.407 |
| 2012/0211760 | A1 * | 8/2012 | Yamada | H01L 29/7787 257/E21.403 |
| 2012/0217591 | A1 * | 8/2012 | Kamada | H01L 23/53223 257/E21.409 |
| 2012/0319127 | A1 * | 12/2012 | Chowdhury | H01L 29/0646 257/E29.089 |
| 2012/0319169 | A1 * | 12/2012 | Van Hove | H01L 29/205 257/E29.246 |
| 2013/0078761 | A1 * | 3/2013 | Sun | H10N 70/8836 257/E21.411 |
| 2013/0181226 | A1 * | 7/2013 | Saitoh | H01L 29/66431 438/172 |
| 2013/0313609 | A1 * | 11/2013 | Akutsu | H01L 29/517 438/285 |
| 2013/0320349 | A1 * | 12/2013 | Saunier | H01L 29/7787 257/E21.409 |
| 2014/0027779 | A1 * | 1/2014 | Hwang | H01L 29/7787 257/76 |
| 2014/0034899 | A1 * | 2/2014 | Ahn | H01L 29/06 977/734 |
| 2014/0092637 | A1 * | 4/2014 | Minoura | H01L 29/7787 438/572 |
| 2014/0335800 | A1 * | 11/2014 | Takeuchi | H01L 29/205 257/190 |
| 2015/0034957 | A1 * | 2/2015 | Chiu | H01L 21/28264 438/585 |
| 2015/0228773 | A1 * | 8/2015 | Tajiri | H01L 29/7787 257/194 |
| 2015/0279907 | A1 * | 10/2015 | Sato | H10K 59/123 438/34 |
| 2015/0349087 | A1 * | 12/2015 | Yao | H01L 21/28575 438/172 |
| 2016/0013276 | A1 * | 1/2016 | Morishita | H01L 29/2003 257/194 |
| 2016/0056145 | A1 * | 2/2016 | Nagumo | H01L 27/0255 257/76 |
| 2016/0190294 | A1 * | 6/2016 | Okamoto | H01L 29/42368 257/194 |
| 2016/0190384 | A1 * | 6/2016 | Huang | H01L 33/002 257/94 |
| 2016/0267873 | A1 * | 9/2016 | Saotome | G09G 3/3677 |
| 2016/0352321 | A1 * | 12/2016 | Yamaguchi | H03K 17/162 |
| 2016/0380010 | A1 * | 12/2016 | Jin | H01L 27/124 438/42 |
| 2017/0104064 | A1 * | 4/2017 | Aoki | H01L 29/7786 |
| 2017/0117402 | A1 * | 4/2017 | Koyama | H01L 29/0843 |
| 2017/0125516 | A1 * | 5/2017 | Ishiguro | H01L 29/7786 |
| 2017/0125563 | A1 * | 5/2017 | Ishiguro | H01L 29/201 |
| 2017/0125565 | A1 * | 5/2017 | Nishimori | H01L 23/66 |
| 2017/0256637 | A1 * | 9/2017 | Isobe | H01L 29/1083 |
| 2017/0358670 | A1 * | 12/2017 | Kub | H01L 23/3732 |
| 2018/0019333 | A1 * | 1/2018 | Kamada | H01L 23/291 |
| 2018/0025911 | A1 * | 1/2018 | Walke | H01L 29/04 257/773 |
| 2018/0026099 | A1 * | 1/2018 | Miyamoto | H01L 23/5286 257/77 |
| 2018/0145163 | A1 * | 5/2018 | Teo | H01L 29/205 |
| 2018/0158904 | A1 * | 6/2018 | Zhao | H01L 29/66969 |
| 2018/0308909 | A1 * | 10/2018 | Shih | G06F 3/044 |
| 2018/0308965 | A1 * | 10/2018 | Then | H01L 21/8258 |
| 2018/0313785 | A1 * | 11/2018 | Jang | H01L 29/205 |
| 2018/0323297 | A1 * | 11/2018 | Suh | H01L 29/66462 |
| 2019/0245090 | A1 * | 8/2019 | Kusayanagi | H01L 29/78618 |
| 2019/0280111 | A1 * | 9/2019 | Shimizu | H01L 29/4236 |
| 2019/0296155 | A1 * | 9/2019 | Sawabe | H01L 29/66969 |
| 2020/0006576 | A1 * | 1/2020 | Ma | H01L 29/775 |
| 2020/0193927 | A1 * | 6/2020 | Kurokawa | G11C 27/04 |
| 2020/0251583 | A1 * | 8/2020 | Chiang | H01L 29/207 |
| 2021/0020769 | A1 * | 1/2021 | Lee | H01L 29/402 |
| 2022/0165866 | A1 * | 5/2022 | Chang | H01L 29/7786 |
| 2022/0165873 | A1 * | 5/2022 | Yang | H01L 29/42372 |
| 2022/0173236 | A1 * | 6/2022 | Lee | H01L 29/402 |
| 2022/0216325 | A1 * | 7/2022 | Fang | H01L 29/66462 |

(56) References Cited

U.S. PATENT DOCUMENTS

| | | | |
|---|---|---|---|
| 2022/0223694 A1* | 7/2022 | Kantarovsky | H01L 29/401 |
| 2022/0271153 A1* | 8/2022 | Chiang | H01L 21/31116 |
| 2023/0129579 A1* | 4/2023 | Lee | H01L 29/401 |
| | | | 257/194 |
| 2023/0163205 A1* | 5/2023 | Chen | H01L 29/2003 |
| | | | 257/133 |
| 2023/0163207 A1* | 5/2023 | Chang | H01L 29/167 |
| | | | 257/192 |
| 2023/0207679 A1* | 6/2023 | Hou | H01L 27/0605 |
| | | | 257/183 |
| 2023/0231022 A1* | 7/2023 | Yang | H01L 23/3192 |
| | | | 257/194 |
| 2023/0238445 A1* | 7/2023 | Lin | H01L 29/2003 |
| | | | 257/183 |

* cited by examiner

HIGH ELECTRON MOBILITY TRANSISTOR (HEMT)

CROSS REFERENCE TO RELATED APPLICATIONS

This application is a continuation of U.S. patent application Ser. No. 16/521,548 filed Jul. 24, 2019, which is herein incorporated by reference in its entirety.

BACKGROUND OF THE INVENTION

1. Field of the Invention

The present invention relates to a high electron mobility transistor (HEMT), and more particularly, to a high electron mobility transistor (HEMT) including a drain electrode and a source electrode having multiple layers.

2. Description of the Prior Art

High electron mobility transistor (HEMT) has various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow high electron mobility transistor (HEMT) to be used in numerous applications including high intensity light emitting diodes (LEDs), power switching devices, regulators, battery protectors, display panel drivers, and communication devices.

High electron mobility transistor (HEMT) is also a field effect transistor, which has a carrier channel formed from a heterojunction at the interface between layers having different bandgap. Ternary compound semiconductors such as gallium arsenide or aluminium gallium arsenide may be utilized to constitute this kind of devices. Instead, other materials may be applied. For instance, indium containing devices have good performance in high frequencies. Gallium nitride (GaN) high electron mobility transistors (HEMT) attract attention recently due to its good performance in high frequencies.

SUMMARY OF THE INVENTION

The present invention provides a high electron mobility transistor (HEMT), which includes a source electrode and a drain electrode, and each of the source electrode and the drain electrode includes a conductive layer and a conductive oxide layer stacked from bottom to top. Due to gold (Au) being replaced by the conductive oxide layer, the processing costs can be reduced while the low contact resistance of these electrodes can be maintained.

The present invention provides a high electron mobility transistor (HEMT) includes a buffer layer, a carrier transit layer, a carrier supply layer, a gate, a source electrode and a drain electrode. The buffer layer is on a substrate. The carrier transit layer is on the buffer layer. The carrier supply layer is on the carrier transit layer. The gate is on the carrier supply layer. The source electrode and the drain electrode are at two opposite sides of the gate, wherein each of the source electrode and the drain electrode includes a conductive layer and a conductive oxide layer stacked from bottom to top.

According to the above, the present invention provides a high electron mobility transistor (HEMT), which includes a buffer layer, a carrier transit layer, a carrier supply layer sequentially stacked on a substrate; a gate located on the carrier supply layer; and, a source electrode and a drain electrode located at two opposite sides of the gate, wherein each of the source electrode and the drain electrode includes a conductive layer and a conductive oxide layer stacked from bottom to top. In this way, the conductive layer has low resistivity, the oxidation of the conductive layer can be avoided due to the conductive oxide layer, and the processing cost of the conductive oxide layer is lower than the processing cost of gold, which is often used on tops of a source electrode and a drain electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
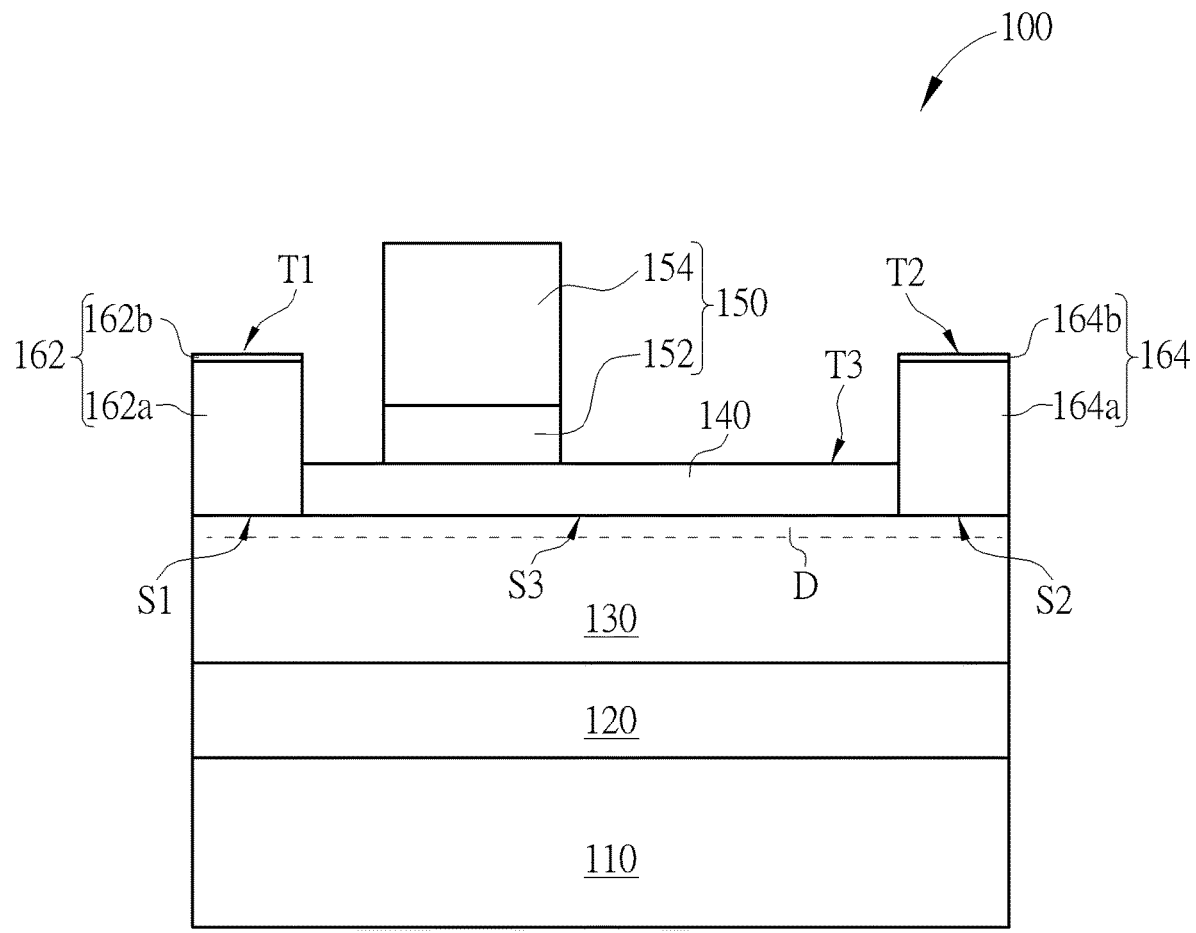
FIG. 1 schematically depicts a cross-sectional view of a high electron mobility transistor (HEMT) according to an embodiment of the present invention.

FIG. 1 schematically depicts a cross-sectional view of a high electron mobility transistor (HEMT) according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a silicon carbide substrate, an aluminum oxide substrate, a graphene-on-silicon substrate or a silicon-on-insulator (SOI) substrate. The substrate 110 may be a single-layered substrate, a multi-layered substrate, a gradient substrate, or combination thereof.

A buffer layer 120 is formed on the substrate 110. The buffer layer 120 may be a stacked III-V group semiconductor layer, wherein the lattice constant of the stacked III-V group semiconductor layer varies gradually from bottom to top. The buffer layer 120 may be gallium nitride (GaN) or aluminum nitride (AlN), but it is not limited thereto. The buffer layer 120 may be formed by a molecular-beam epitaxy (MBE) process, a metal organic chemical vapor deposition (MOCVD) process, a chemical vapor deposition (CVD) process, a hydride vapor phase epitaxy (HYPE) process, or combination thereof.

A carrier transit layer 130 is formed on the buffer layer 120. In this embodiment, the carrier transit layer 130 may be a stacked III-V group semiconductor layer, but it is not limited thereto. Preferably, the carrier transit layer 130 may be an unintentionally doped (UID) gallium nitride (GaN) layer. The carrier transit layer 130 may be formed by a molecular-beam epitaxy (MBE) process, a metal organic chemical vapor deposition (MOCVD) process, a chemical vapor deposition (CVD) process, a hydride vapor phase epitaxy (HYPE) process, or combination thereof.

A carrier supply layer 140 is formed on the carrier transit layer 130, thereby a channel region D being formed at an interface of the carrier transit layer 130 and the carrier supply layer 140. The channel region D is the region where conductive current is formed by the 2DEG and in such condition the HEMT device is typically operated under a "normally on" mode. Typically a heterojunction is formed at the interface between the carrier transit layer 130 and carrier supply layer 140 as a result of the bandgap difference between the two layers 130, 140. Essentially a quantum well is formed in the banding portion of the conduction band of the heterojunction to constrain the electrons generated by piezoelectricity so that two-dimensional electron gas (2DEG) is formed at the junction between the carrier transit layer 130 and carrier supply layer 140 to form conductive current.

In this embodiment, the carrier supply layer 140 may be a III-V group semiconductor layer, but it is not limited thereto. Preferably, the carrier supply layer 140 may be an unintentionally doped (UID) $Al_xGa_{1-x}N$ layer, an n-type $Al_xGa_{1-x}N$ layer or a p-type $Al_yGa_{1-y}N$ layer. In one case, the carrier supply layer 140 maybe formed by an epitaxial growth process, which may include silicon or germanium etc. Perhaps, the carrier supply layer 140 may be a molecular-beam epitaxy (MBE) process, a metal organic chemical vapor deposition (MOCVD) process, a chemical vapor deposition (CVD) process, a hydride vapor phase epitaxy (HYPE) process, or combination thereof.

A gate 150 is formed on the carrier supply layer 140. The gate 150 may include a bottom part 152 and a top part 154, wherein the bottom part 152 and the top part 154 preferably include different materials. Preferably, the bottom part 152 may be p-type $Al_yGa_{1-y}N$ while the top part 154 may be metal, which may include Schottky metal such as gold, silver, platinum or etc. Methods of forming the gate 150 on the carrier supply layer 140 may include the following. For example, a semiconductor bottom layer and a gate material layer are sequentially formed on the carrier supply layer 140, and then parts of the semiconductor bottom layer and the gate material layer are etched by processes such as photolithography and etching processes to form the gate 150. As current gate electrodes typically made of metal gradually imports material such as p-type GaN to serve as bottom portion for the gate electrode, the operation of HEMT devices under this circumstance now shifts from "normally on" to "normally off".

A source electrode 162 and a drain electrode 164 are formed at two opposite sides of the gate 150. In the present invention, the source electrode 162 may include a conductive layer 162a and a conductive oxide layer 162b stacked from bottom to top, and the drain electrode 164 may include a conductive layer 164a and a conductive oxide layer 164b stacked from bottom to top. Preferably, thicknesses of the conductive oxide layers 162b/164b are less than thicknesses of the conductive layers 162a/164a. In this embodiment, the conductive oxide layers 162b/164b are at top surfaces of the conductive layers 162a/164a, or the conductive oxide layers 162b/164b only cover the top surfaces of the conductive layers 162a/164a. In a preferred embodiment, the conductive layers 162a/164a may include metals such as titanium (Ti), aluminum (Al), tungsten (W), palladium (Pd), and the conductive oxide layers 162b/164b may include indium tin oxide (ITO), but it is not limited thereto. In this case, the conductive layers 162a/164a may be titanium while the conductive oxide layers 162b/164b may be indium tin oxide (ITO).

More precisely, the source electrode 162 and the drain electrode 164 are located in parts of the carrier supply layer 140. Top surfaces T1/T2 of the source electrode 162 and the drain electrode 164 are higher than a top surface T3 of the carrier supply layer 140. Preferably, a bottom surface S1 of the source electrode 162, a bottom surface S2 of the drain electrode 164 and a bottom surface S3 of the carrier supply layer 140 are coplanar, so that the source electrode 162 and the drain electrode 164 can directly contact a two-dimensional electron gas (2DEG) channel at the interface of the carrier transit layer 130 and the carrier supply layer 140. The source electrode 162 and the drain electrode 164 are preferably composed of metals, which are different from the top part 154 of the gate 150 composed of Schottky metal. The source electrode 162 and the drain electrode 164 are preferably composed of ohmic contact metals, wherein the source electrode 162 and the drain electrode 164 maybe composed of titanium (Ti), aluminum (Al), tungsten (W), palladium (Pd) or combination thereof.

In this embodiment, it would be desirable to first conduct a photo-etching process to remove parts of the carrier supply layer 140 at two opposite sides of the gate 150 for forming recesses, conduct an electroplating process, sputtering process, resistance heating evaporation process, electron beam evaporation process, physical vapor deposition (PVD) process, chemical vapor deposition (CVD) process, or combination thereof to form electrode materials in the recesses, and then pattern the electrode materials through etching process to form the source electrode 162 and the drain electrode 164. Thereby, a high electron mobility transistor (HEMT) 100 is formed.

Figure 2:
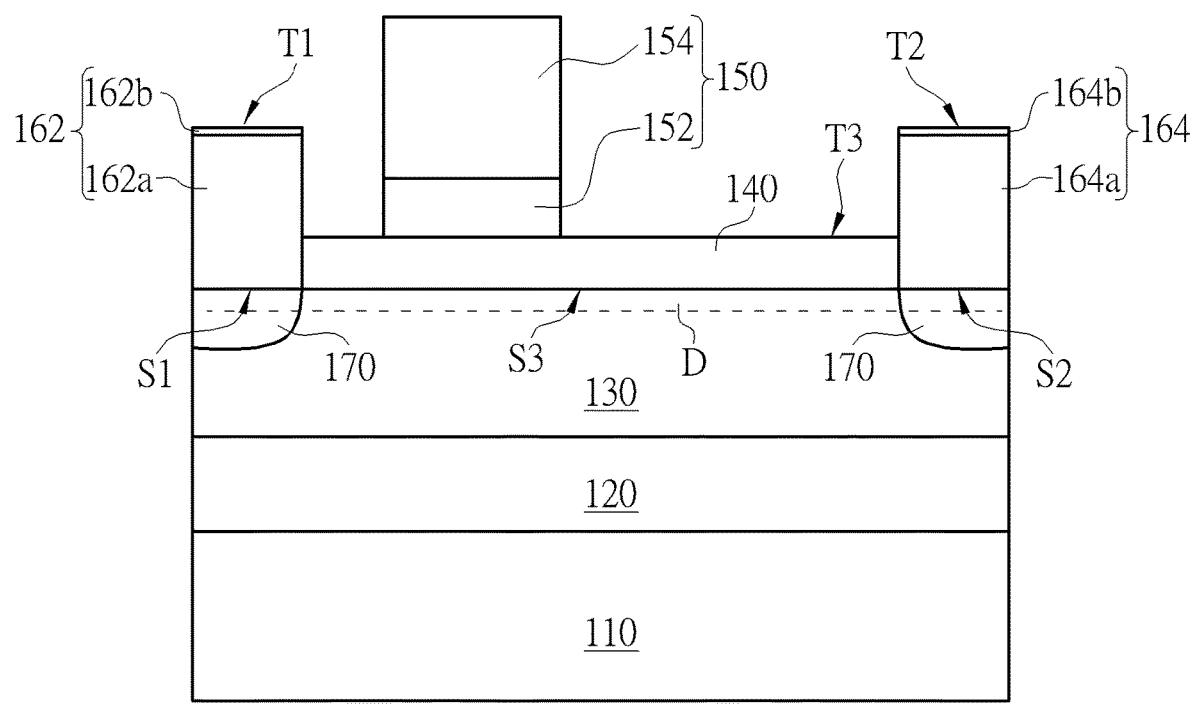
FIG. 2 schematically depicts a cross-sectional view of a high electron mobility transistor (HEMT) according to an embodiment of the present invention.

An improved high electron mobility transistor (HEMT) is presented as follows. FIG. 2 schematically depicts a cross-sectional view of a high electron mobility transistor (HEMT) according to an embodiment of the present invention. As shown in FIG. 2, after the high electron mobility transistor (HEMT) 100 is formed, doping regions 170 may be formed right below the source electrode 162 and the drain electrode 164. The doping regions 170 may be doped with silicon or germanium etc. For the doping regions 170 being doped with silicon as an example, the doping regions 170 may be formed by depositing silicon layers and then treating thermal diffusion, or the doping regions 170 may be doped with silicon directly, but it is not limited thereto. Preferably, the doping regions 170 may be only located right below the source electrode 162 and the drain electrode 164. Since the source electrode 162 and the drain electrode 164 are easier to be form on the doping regions 170, the doping regions 170 preferably contact the source electrode 162 and the drain electrode 164 directly.

Figure 3:
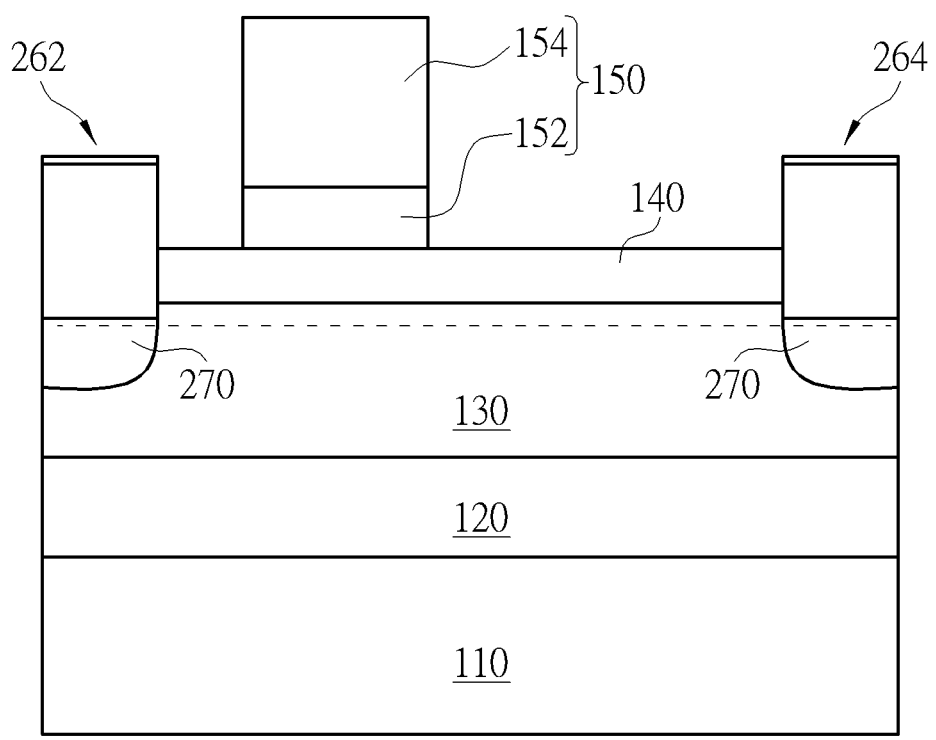
FIG. 3 schematically depicts a cross-sectional view of a high electron mobility transistor (HEMT) according to an embodiment of the present invention.
Figure 4:
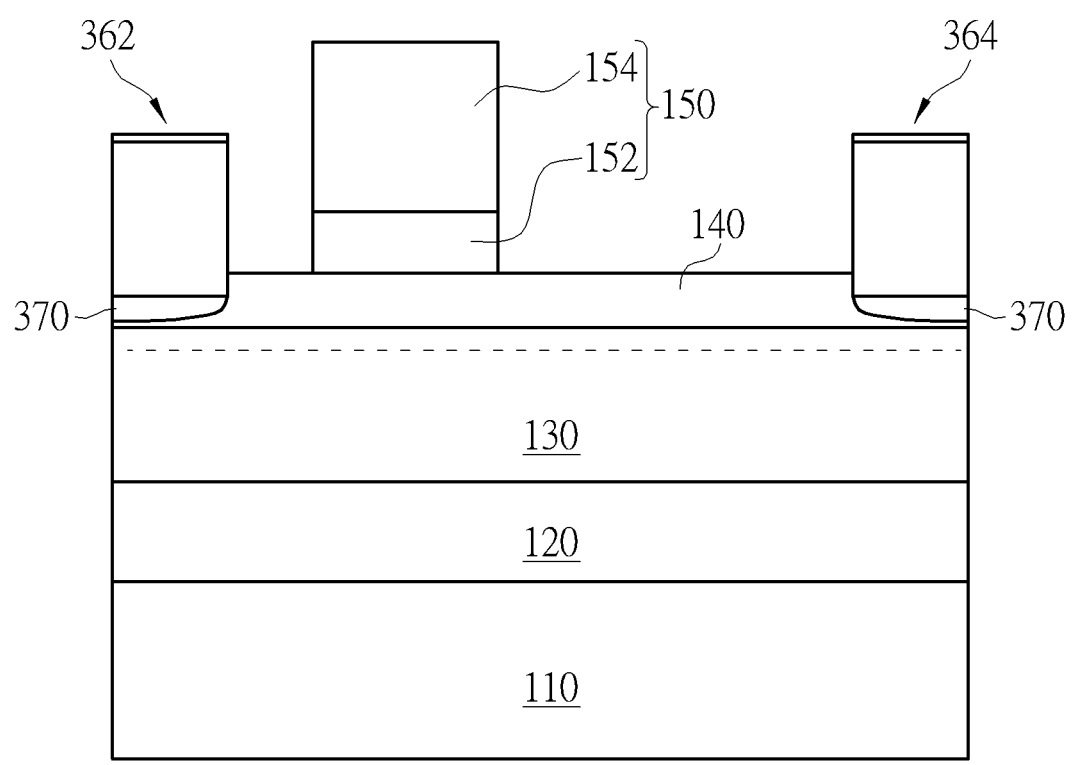
FIG. 4 schematically depicts a cross-sectional view of a high electron mobility transistor (HEMT) according to an embodiment of the present invention.

In this embodiment, the doping regions 170 may be located in parts of the carrier transit layer 130 right below the source electrode 162 and the drain electrode 164. In other embodiments, as shown in FIG. 3, the doping regions 170 are only in parts of the carrier transit layer 130 and the carrier supply layer 140 right below the source electrode 162 and the drain electrode 164. Or, as shown in FIG. 4, the doping regions 370 only in parts of the carrier supply layer 140 right below the source electrode 362 and the drain electrode 364.

To summarize, the present invention provides a high electron mobility transistor (HEMT), which includes a buffer layer on a substrate; a carrier transit layer on the buffer layer; a carrier supply layer on the carrier transit layer; a gate located on the carrier supply layer; and, a source electrode and a drain electrode located at two opposite sides of the gate, wherein each of the source electrode and the drain electrode includes a conductive layer and a conductive oxide layer stacked from bottom to top. In this way, the conductive layer has low resistivity, the oxidation of the conductive layer can be avoided due to the conductive oxide layer, and the processing cost of the conductive oxide layer is lower than the processing cost of gold, which is often used on tops of a source electrode and a drain electrode.

Preferably, a thickness of the conductive oxide layer is less than a thickness of the conductive layer. The conductive layer may be metals such as titanium (Ti), aluminum (Al), tungsten (W), palladium (Pd), and the conductive oxide layer may be indium tin oxide (ITO). Still preferably, doping regions are right below the source electrode and the drain electrode because of ohmic contact being easier to be formed on the doping regions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
    a buffer layer on a substrate;
    a carrier transit layer on the buffer layer;
    a carrier supply layer on the carrier transit layer;
    a gate on the carrier supply layer; and
    a source electrode and a drain electrode at two opposite sides of the gate, wherein each of the source electrode and the drain electrode comprises a conductive layer and a conductive oxide layer stacked from bottom to top, wherein a thickness of the conductive oxide layer is less than a thickness of the conductive layer, wherein the conductive oxide layer only covers a top surface of the conductive layer of the source electrode and a top surface of the conductive layer of the drain electrode, and the conductive oxide layer does not contact a sidewall of the conductive layer of the source electrode and a sidewall of the conductive layer of the drain electrode, wherein a sidewall of the conductive oxide layer is aligned with a sidewall of the conductive layer, the conductive oxide layer comprises indium tin oxide (ITO), and wherein the conductive oxide layer contacts the conductive layer directly.

2. The high electron mobility transistor (HEMT) according to claim 1, wherein the conductive layer comprises metal.

3. The high electron mobility transistor (HEMT) according to claim 1, further comprising:
    doping regions only located right below the source electrode and the drain electrode.

4. The high electron mobility transistor (HEMT) according to claim 3, wherein the doping regions are only in parts of the carrier transit layer right below the source electrode and the drain electrode.

5. The high electron mobility transistor (HEMT) according to claim 3, wherein the doping regions are only in parts of the carrier supply layer right below the source electrode and the drain electrode.

6. The high electron mobility transistor (HEMT) according to claim 3, wherein the doping regions are only in parts of the carrier transit layer and the carrier supply layer right below the source electrode and the drain electrode.

* * * * *